(12) United States Patent
Nakagawa et al.

(10) Patent No.: US 11,467,016 B2
(45) Date of Patent: Oct. 11, 2022

(54) SEMICONDUCTOR DEVICE AND SENSOR SYSTEM

(71) Applicant: HITACHI AUTOMOTIVE SYSTEMS, LTD., Hitachinaka (JP)

(72) Inventors: Tatsuo Nakagawa, Tokyo (JP); Akeo Satoh, Ibaraki (JP); Akira Kotabe, Ibaraki (JP); Masahiro Matsumoto, Tokyo (JP)

(73) Assignee: HITACHI ASTEMO, LTD., Ibaraki (JP)

( * ) Notice: Subject to any disclaimer, the term of this patent is extended or adjusted under 35 U.S.C. 154(b) by 93 days.

(21) Appl. No.: 17/058,268

(22) PCT Filed: May 9, 2019

(86) PCT No.: PCT/JP2019/018640
§ 371 (c)(1),
(2) Date: Nov. 24, 2020

(87) PCT Pub. No.: WO2019/239752
PCT Pub. Date: Dec. 19, 2019

(65) Prior Publication Data
US 2021/0215523 A1    Jul. 15, 2021

(30) Foreign Application Priority Data

Jun. 11, 2018    (JP) .............................. JP2018-111252

(51) Int. Cl.
*G01F 15/02*      (2006.01)
*H03F 3/45*       (2006.01)
*H01L 29/10*      (2006.01)

(52) U.S. Cl.
CPC ........ *G01F 15/022* (2013.01); *H01L 29/1087* (2013.01); *H03F 3/45475* (2013.01);
(Continued)

(58) Field of Classification Search
CPC ... G01F 15/022; G06F 2119/10; G01R 29/26; H01L 29/1087; H01L 29/00; H01L 29/02;
(Continued)

(56) References Cited

U.S. PATENT DOCUMENTS 4,599,554 A * 7/1986 Jaycox ................... G01R 19/15
                                                      327/434
4,791,379 A   12/1988 Hughes
(Continued)

FOREIGN PATENT DOCUMENTS

JP    S61-189718 A    8/1986
JP    02-063306 A     3/1990
(Continued)

OTHER PUBLICATIONS

International Search Report and English Translation, PCT/JP2019/018640, dated Jul. 30, 2019, 8 pgs.
(Continued)

*Primary Examiner* — Daniel R Miller
*Assistant Examiner* — Eric Sebastian Von Wald
(74) *Attorney, Agent, or Firm* — Volpe Koenig

(57) ABSTRACT

Provided are a semiconductor device and a sensor system capable of achieving improvement of noise resistance. Thus, an output circuit 106a in the semiconductor device includes: input terminals 207n, 207p; and an output terminal 208; an output amplifier 201 connecting the input terminals 207n, 207p to the output terminal 208; a feedback element 203 returning the output terminal 208 to the input terminal 207n; a switching transistor 204; and a resistance element 206. A drain of the switching transistor 204 is connected to the input terminal 207n. The resistance element 206 is provided between a back gate of the switching transistor 204 and a power source Vdd and has impedance of a predetermined
(Continued)

value or more for suppressing noise of a predetermined frequency generated at the input terminal 207n.

14 Claims, 8 Drawing Sheets

(52) U.S. Cl.
CPC .............. *H03F 2200/129* (2013.01); *H03F 2203/45116* (2013.01)

(58) Field of Classification Search
CPC ..... H01L 29/06; H01L 29/10; H01L 29/1075; H01L 29/1079; H01L 2924/1424; H01L 2924/141; H01L 2924/13063; H01L 2924/13091; H01H 33/58; H03F 3/45475; H03F 3/00; H03F 3/45071; H03F 3/45076; H03F 3/45488; H03F 3/4578; H03F 3/45497; H03F 3/45506; H03F 2200/00; H03F 2200/129; H03F 2203/45116; H03F 2203/45; H03F 2203/45118; H03F 3/45556; H03F 2200/372; H03F 2200/378; H03H 11/126; H03H 11/00; H03H 11/12; Y10S 388/91; H01J 2223/11; H04B 10/697
See application file for complete search history.

(56) References Cited

U.S. PATENT DOCUMENTS

| | | | |
|---|---|---|---|
| 6,184,663 | B1 | 2/2001 | Imai et al. |
| 10,886,915 | B2* | 1/2021 | Rostaing .............. H03K 17/687 |
| 11,251,759 | B2* | 2/2022 | Ivanov ................ H03F 3/45076 |
| 2001/0050410 | A1 | 12/2001 | Aswell |
| 2005/0134384 | A1 | 6/2005 | Sato |
| 2015/0056077 | A1* | 2/2015 | Tevs ....................... G01H 13/00 |
| | | | 416/61 |
| 2016/0026207 | A1 | 1/2016 | Boling |

FOREIGN PATENT DOCUMENTS

| | | |
|---|---|---|
| JP | 07-086525 A | 3/1995 |
| JP | 2000-180498 A | 6/2000 |
| JP | 2004-500710 A | 1/2004 |
| JP | 2005-204297 A1 | 7/2005 |
| JP | 2008-54075 A | 3/2008 |
| JP | 2015-119304 A | 6/2015 |
| JP | 2016-032295 A | 3/2016 |
| WO | 2011/104800 A1 | 9/2011 |

OTHER PUBLICATIONS

Japanese Office Action dated Aug. 3, 2021 for Japanese Patent Application No. 2018-111252.

* cited by examiner

SEMICONDUCTOR DEVICE AND SENSOR SYSTEM

TECHNICAL FIELD OF THE INVENTION

The present invention relates to a semiconductor device and a sensor system, for example, a vehicle-mounted semiconductor device and a sensor system.

BACKGROUND ART

Patent Document 1 discloses a configuration in which a MOSFET is provided between an input terminal of an operational amplifier and a ground terminal. The MOSFET maintains a turned-off state by applying a bias voltage to a gate and a back gate, and clamps a drain potential to the bias voltage by using a parasitic diode between the drain and the back gate. Further, Patent Document 2 discloses a circuit for gently changing a voltage by measuring a load current and controlling the load current to have a trapezoidal waveform in order to suppress spike noise when a load is turned on and off.

RELATED ART DOCUMENTS

Patent Documents

Patent Document 1: JP 2005-204297 A
Patent Document 2: U.S. Pat. No. 6,184,663

SUMMARY OF THE INVENTION

Problems to be Solved by the Invention

A semiconductor device equipped with an output circuit that outputs an analog voltage has been widely used. For example, an output circuit in a vehicle-mounted semiconductor device may transmit an analog voltage to an engine control unit (ECU) or the like via a relatively long output wiring. However, induced noise may be applied to this output wiring from another device, another wiring, or the like. Accordingly, there is a concern that malfunction of the output circuit occurs.

The present invention has been made in view of the above circumstances, and one of objects thereof is to provide a semiconductor device and a sensor system that are capable of improving noise resistance.

The aforementioned objects of the present invention, other objects, and novel features will be apparent from the description of the present specification and the accompanying drawings.

Means for Solving the Problems

A brief description of an outline of a representative embodiment of embodiments disclosed in the present application is as follows.

A semiconductor device according to the representative embodiment of the present invention includes an input terminal, an output terminal, a first circuit that connects the input terminals to the output terminal, a feedback path that returns the output terminal to the input terminal, a transistor, and a second circuit. The transistor has a gate, a back gate, a source, and a drain connected to the input terminal. The second circuit is provided between the back gate and a power source and has impedance of a predetermined value or more for suppressing noise of a predetermined frequency generated at the input terminal.

Effects of the Invention

If effects obtained by the representative embodiment of the inventions disclosed in the present application are briefly described, it is possible to improve noise resistance.

DETAILED DESCRIPTION OF PREFERRED EMBODIMENTS

In the following embodiments, the invention will be divided into a plurality of sections or embodiments and described when required as a matter of convenience. However, these sections or embodiments are not unrelated to each other and one is related to some or all of the other modification examples, details, supplementary descriptions, and the like unless otherwise specified. Further, in the following embodiments, when the number of elements (including number of pieces, numerical value, amount, range, and the like) is referred to as, the number of the elements is not limited to a specific number except for a case where the number of elements is particularly specified, a case where the number of elements is obviously limited to the specific number in principle, and the like, and may be equal to, larger, or smaller than the specific number.

Furthermore, in the following embodiments, needless to say, the constituent elements (including element steps, etc.) are not necessarily essential except for the case where the constituent elements are explicitly stated or considered to be essential in principle. Similarly, in the following embodiments, when shapes, positional relationships, and the like of the constituent elements are referred to as, the shapes or the like thereof are included in ones substantially approximating or similar to the shapes or the like except for the cases where the shapes or the like are explicitly specified and where the shapes or the like are not obviously the ones in principle. The same applies also to the aforementioned numerical value and range.

Further, a circuit element forming each functional block of the embodiments is not particularly limited, but is formed on a semiconductor substrate such as single crystal silicon by a known integrated circuit technology such as a CMOS (complementary MOS) transistor. Hereinafter, the embodiments of the present invention will be described with reference to the drawings. Note that, in all the drawings for describing the embodiments, the same members are denoted by the same reference signs in principle, and repetitive description thereof will be omitted.

First Embodiment

Outline of Sensor System

Figure 1:
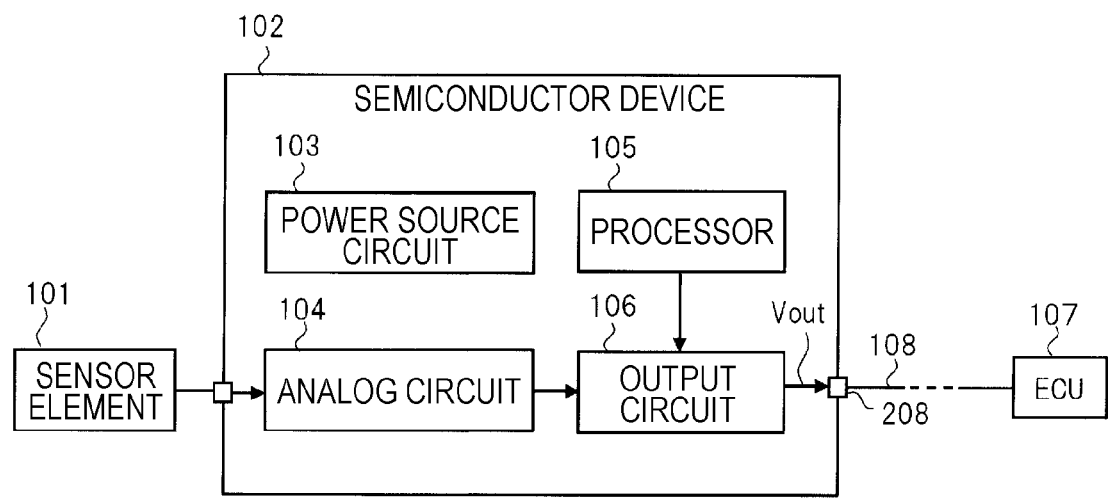
FIG. 1 is a schematic diagram illustrating a configuration example of a sensor system according to a first embodiment of the present invention.

FIG. 1 is a schematic diagram illustrating a configuration example of a sensor system according to a first embodiment of the present invention. The sensor system illustrated in FIG. 1 is, for example, a vehicle-mounted sensor system, and includes a sensor element 101, a semiconductor device 102, and an ECU 107. The sensor element 101 is an element of which electrical characteristics change according to a physical quantity, and outputs an electric signal corresponding to a change in a detection target. The sensor element 101 is, for example, an air flow sensor which is an element for measuring an amount of air sucked by an engine, but is not particularly limited thereto. That is, the sensor element 101 converts physical quantities such as air flow rate, temperature, humidity, and pressure into electrical signals, and outputs the electrical signals.

The semiconductor device 102 includes a power source circuit 103, an analog circuit 104, a processor 105, and an output circuit 106, and is formed as, for example, one semiconductor chip. The semiconductor device 102 mainly processes the electric signal from the sensor element 101, and outputs a processing result with an analog signal or the like via the output circuit 106. The analog circuit 104 performs processings such as amplification, filtering, analog-to-digital conversion, and digital-to-analog conversion on the electric signal from the sensor element 101. The processor 105 processes digital data, and controls peripheral circuits. The power source circuit 103 generates an internal power supply from an external power supply, and distributes the power supply to each circuit. The output circuit 106 receives a processing result from the analog circuit 104, and outputs an output signal (for example, an analog signal) Vout to the ECU 107 via an output terminal 208 and an output wiring 108.

Such a vehicle-mounted semiconductor device 102 may be exposed to strong noise. Specifically, induced noise is applied to the output wiring 108 from another device, another wiring, or the like. For example, the output wiring 108 has a wiring length of several meters to about 10 meters at the maximum. For example, another wiring running in parallel with the output wiring 108 may transmit an electric signal that oscillates at a frequency of several hundred kHz to several tens MHz with an amplitude of several hundred V or more. Accordingly thereto, the induced noise is applied to the output wiring 108 due to inductive coupling between the wirings, and the induced noise is at risk of causing malfunction of the output circuit 106.

Configuration and Problems of Output Circuit
(Comparative Example)

Figure 11:
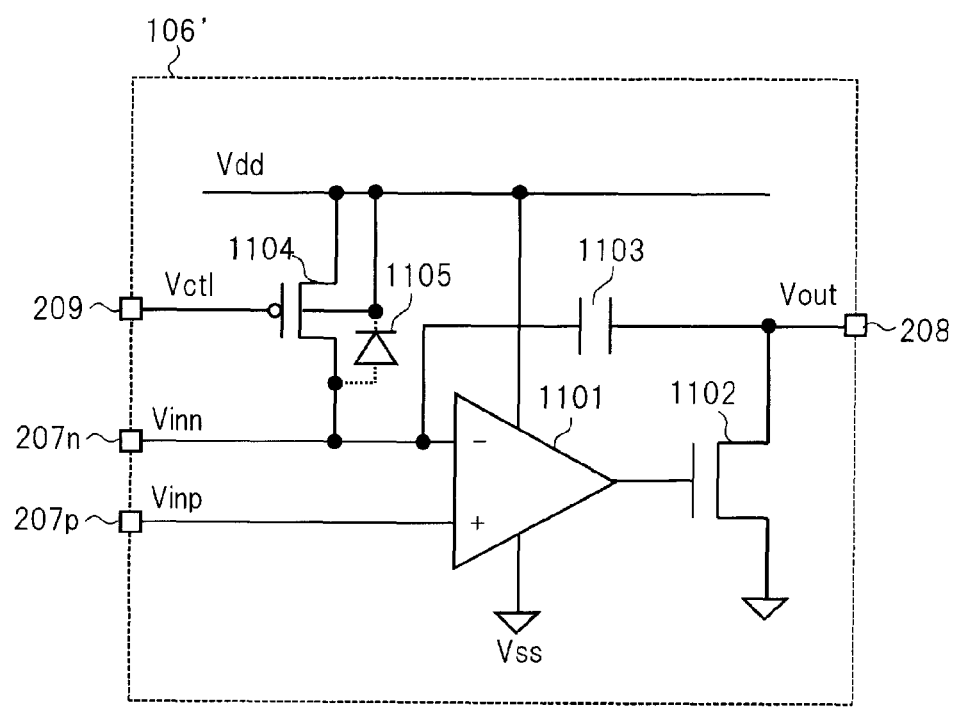
FIG. 11 is a circuit diagram illustrating a schematic configuration example of a main part of an output circuit in a semiconductor device as a comparative example of the present invention.

Here, prior to description of the semiconductor device (specifically, the output circuit) according to the first embodiment, an output circuit as a comparative example will be described. FIG. 11 is a circuit diagram illustrating a schematic configuration example of a main part of an output circuit in a semiconductor device as a comparative example of the present invention. An output circuit 106' illustrated in FIG. 11 corresponds to the output circuit 106 of FIG. 1, and includes input terminals 207n and 207p, a control input terminal 209, an output terminal 208, an output amplifier 1101, an output transistor 1102, a capacitance element 1103, and a switching transistor 1104.

In this example, the output transistor 1102 is an n-channel MOS transistor (nMOS transistor), and the switching transistor 1104 is a p-channel MOS transistor (pMOS transistor). The input terminals 207n and 207p constitute a differential pair. The output amplifier 1101 and the output transistor 1102 serve as a circuit (first circuit) that connects the input terminals 207n and 207p to the output terminal 208 by using the output amplifier 1101 as a front stage amplifier and the output transistor 1102 as a rear stage amplifier.

The output amplifier 1101 is a differential operational amplifier that operates by a power source Vdd (for example, 3.3 V) on a high potential side on the basis of a power source Vss (for example, 0 V) on a low potential side. The output amplifier 1101 controls a gate of the output transistor 1102 according to input signals (differential input signals) Vinn and Vinp from the input terminals 207n and 207p. The output transistor 1102 outputs an output signal Vout to a drain connected to the output terminal 208 depending on the control of the output amplifier 1101. The capacitance element 1103 is provided in a feedback path that returns the output terminal 208 to the input terminal 207n (negative feedback).

A source and a drain of the switching transistor 1104 are connected to the power source Vdd and the input terminal 207n, respectively. A control signal Vctl from the control input terminal 209 is inputted to a gate of the switching transistor 1104. The control signal Vctl is controlled to have a level different from levels of an operation state and a standby state of the output amplifier 1101. Note that, although not illustrated, the switching transistor 1104 is actually provided also to the input terminal 207p.

For example, the processor 105 of FIG. 1 controls the switching transistor 1104 to be turned off by controlling the control signal Vctl to a voltage level of the power source Vdd on the high potential side when the output amplifier 1101 is operated. As a result, the output amplifier 1101 performs an output operation of maintaining the input terminals 207n and 207p (input signals Vinn and Vinp) at the same potential. Meanwhile, the processor 105 controls the switching transistor 1104 to be turned on by controlling the control signal Vctl to a voltage level of the low-potential-side power source Vss when the output amplifier 1101 is transitioned to the standby state. As a result, both the input signals Vinn and Vinp are fixed to the voltage level of the power source Vdd, and the output amplifier 1101 is in the standby state (inactive state).

Here, in detail, the switching transistor 1104 includes a parasitic diode 1105 having the drain side as an anode and the back gate side as a cathode between the drain and a back gate. The back gate of the switching transistor 1104 is normally connected to the source (that is, the power source Vdd) as illustrated in FIG. 11.

Figure 12:
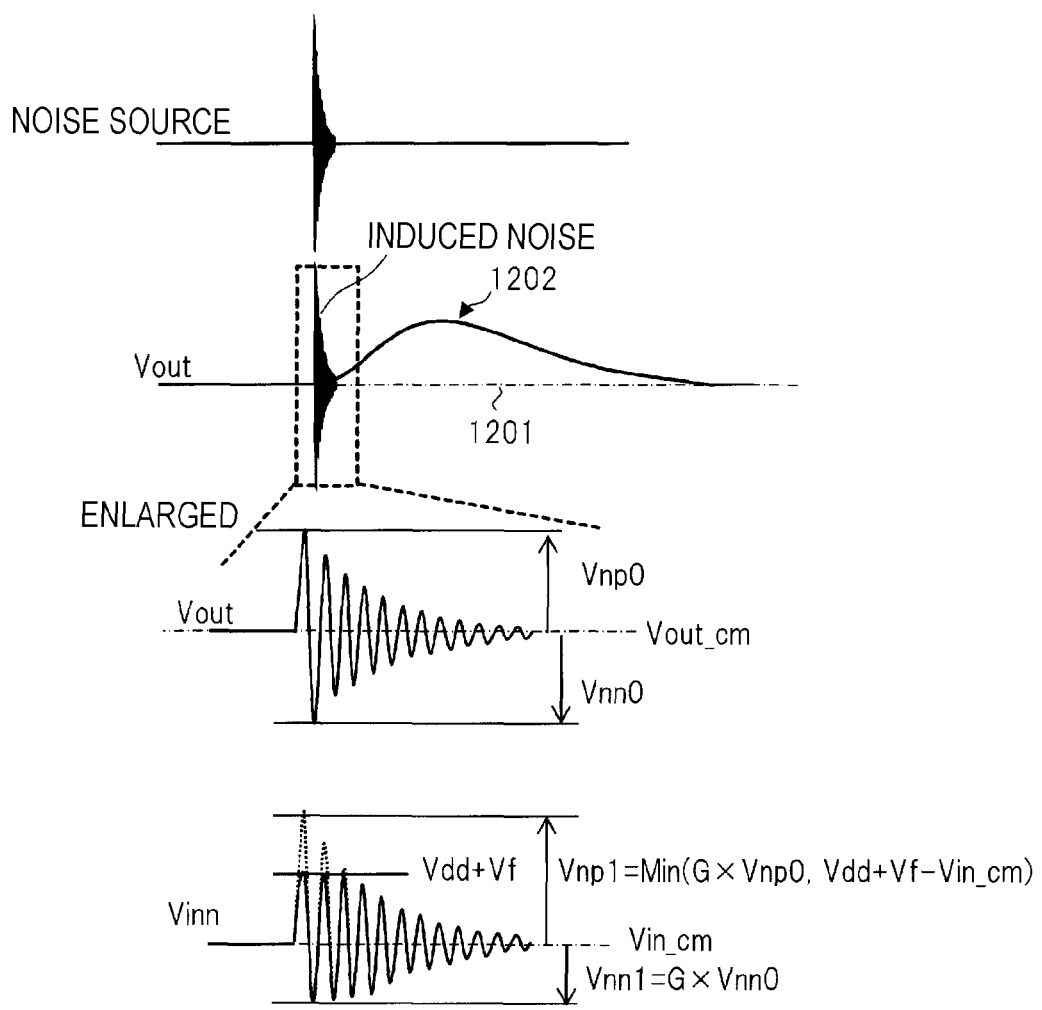
FIG. 12 is a waveform diagram illustrating an example of a voltage state of each unit when induced noise is applied to the output circuit of FIG. 11.

FIG. 12 is a waveform diagram illustrating each example of voltage states of units when the induced noise is applied to the output circuit of FIG. 11. As described in FIG. 1, the induced noise may be applied to the output wiring 108 connected to the output terminal 208. In this case, as illustrated in FIG. 12, pulsed induced noise is superimposed on the output signal Vout.

Here, the superposition of the induced noise itself does not cause any particular problem. This is because even though the induced noise is superimposed on an original voltage level 1201 of the output signal Vout, the original voltage level 1201 itself does not change. In other words, this a because a voltage level after the induced noise is removed or a voltage level after the induced noise is stopped is usually equal to the voltage level 1201 before the induced noise is superimposed. However, the present inventors have found that an error with the original voltage level 1201 as a reference may be actually caused in the voltage level of the output signal Vout for a somewhat long period due to the induced noise as illustrated by the reference sign 1202 in FIG. 12.

The error in the voltage level of the output signal Vout is caused as follows. First, the noise superimposed on the output signal Vout is coupled to the input terminal 207n (input signal Vinn) of the output amplifier 1101 via the capacitance element 1103. The parasitic diode 1105 exists between the input terminal 207n and the back gate of the switching transistor 1104. Thus, when the potential of the input signal Vinn becomes higher than the potential of the power source Vdd by a forward voltage Vf of the parasitic diode 1105, the parasitic diode 1105 is turned on, and a forward current flows.

That is, when the potential of the input signal Vinn oscillates at a high frequency due to the propagation of the induced noise and the potential thereof becomes higher than "Vdd+Vf", a current flows from the input terminal 207n to the power source Vdd. In other words, the potential of the input signal Vinn is clipped by the potential of "Vdd+Vf". When such a current flows (when a clip occurs), electric charges are effectively injected from the power source Vdd to the input terminal 207n and the input signal Vinn is generated at a path different from that of the input terminal 207n (here, a path of the power source Vdd).

When the electric charges are supplied to the input terminal 207n, an error from the original voltage level as a reference is caused in the voltage level of the input signal Vinn, so that the error from the original voltage level 1201 as the reference is caused also in the voltage level of the output signal Vout. In order for the voltage level of the output signal Vout to return to the original voltage level 1201, it is necessary to reduce the electric charges injected from the power source Vdd into the input terminal 207n. However, when the input terminal 207n has high impedance, it is difficult for the electric charges to escape and it takes a somewhat long time to reduce the injected electric charges.

In this way, it has been found that the error in the output signal Vout is caused as a result in which the induced noise applied to the output terminal 208 is transmitted to the input terminal 207n via the capacitance element 1103 and accordingly the electric charges are injected into the input terminal 207n via the parasitic diode 1105. A condition in which the error in the output signal Vout is caused can be approximately expressed by Expression (1). In Expression (1), "Vin_cm" is a potential of the input terminal 207n (input signal Vinn) when the induced noise is not applied. "G" is a gain of the induced noise from the output terminal 208 to the input terminal 207n. "Vnp0" is a positive-electrode-side amplitude of the induced noise, which is applied to the output terminal 208, from a potential "Vout_cm" of the output terminal 208 (output signal Vout) as a reference when the induced noise is not applied.

$$G \times Vnp0 + Vin\_cm > Vdd + Vf \qquad (1)$$

As expressed in Expression (1), when the maximum value of the induced noise coupled to the input terminal 207n becomes higher than "Vdd+Vf", the error in the output signal Vout is caused. The occurrence of the error in the output signal Vout is equivalent to the malfunction of the output circuit 106'. In particular, the vehicle-mounted semiconductor device 102 illustrated in FIG. 1 has important functions such as monitoring and controlling a state of a vehicle, and needs to have a noise resistance (in other words, reliability) higher than that of consumer products so that malfunction does not occur due to noise. Thus, it is useful to use the output circuit according to the first embodiment as described below.

Configuration of Output Circuit (First Embodiment)

Figure 2:
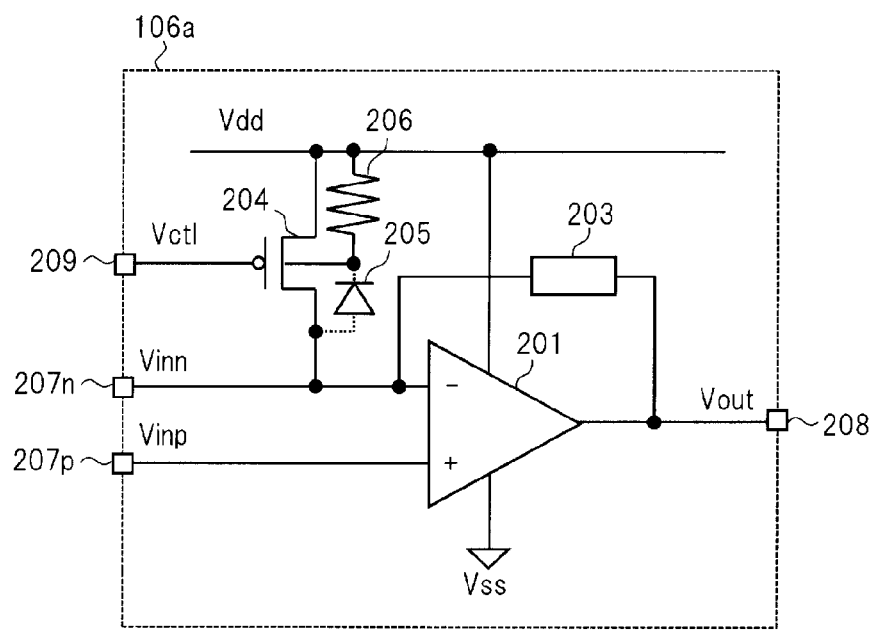
FIG. 2 is a circuit diagram illustrating a schematic configuration example of a main part of an output circuit in a semiconductor device according to the first embodiment of the present invention.

FIG. 2 is a circuit diagram illustrating a schematic configuration example of a main part of the output circuit in the semiconductor device according to the first embodiment of the present invention. An output circuit 106a illustrated in FIG. 2 corresponds to the output circuit 106 of FIG. 1, and includes input terminals 207n and 207p, a control input terminal 209, an output terminal 208, an output amplifier 201, a feedback element 203, a switching transistor 204, and a resistance element 206. In this example, the switching transistor 204 is a pMOS transistor.

The output amplifier 201 is a circuit (first circuit) that connects the input terminals 207n and 207p to the output terminal 208 and is, for example, a differential operational amplifier that operates by the power source Vdd (for example, 3.3 V) on the high potential side on the basis of the power source Vss (for example, 0 V) on the low potential side. In this example, unlike the case of FIG. 11, the output amplifier 201 outputs the output signal Vout to the output terminal 208 without passing through the output transistor. However, as in the case of FIG. 11, a constitution of passing through the output transistor may be adopted.

The feedback element 203 is provided on a feedback path that returns the output terminal 208 to the input terminal 207n (negative feedback). The feedback element 203 is typically a capacitance element 1103 illustrated in FIG. 11, but the feedback element is not limited thereto, and may be a resistance element, parasitic capacitance, or the like. That is, it is only required that some kind of feedback path be present. Even though there is the feedback path such as the resistance element or the parasitic capacitance, the coupling of the induced noise from the output terminal 208 to the input terminal 207n as described with reference to FIG. 12 may occur, so that the same problem as the case of FIG. 12 can arise. However, the coupling of the induced noise can be more frequently caused when the feedback element 203 is especially a capacitance element, so that the problem described in FIG. 12 can be more remarkable in this case.

Similarly to the case of FIG. 11, the switching transistor 204 has a source and a drain connected to the power source Vdd and the input terminal 207n, respectively, and a gate connected to the control input terminal 209. Further, as in the case of FIG. 11, a parasitic diode 205 exists between the drain (input terminal 207n) of the switching transistor 204 and a back gate. However, unlike the case of FIG. 11, here, the resistance element 206 is provided between the power source Vdd and the back gate of the switching transistor 204. The resistance element 206 is an example of a circuit (second circuit) whose impedance has a predetermined value or more for suppressing noise of a predetermined frequency generated in the input terminal 207n.

Note that a connection destination of the resistance element 206 is not necessarily the power source Vdd of the output amplifier 201, but may be any power source through which the switching transistor 204 can operate normally. Further, the source of the switching transistor 204 is not necessarily connected to the power source Vdd of the output amplifier 201, but may be any power source through which the output amplifier 201 can be set in the standby state and ON and OFF control can be normally performed by the control signal Vctl.

In such a configuration, the induced noise applied to the output terminal 208 is coupled to the input terminal 207n (input signal Vinn) via the feedback element 203, thereby causing the oscillation of the input signal Vinn. In the case of FIG. 11, the parasitic diode is turned on with the oscillation of the input signal Vinn, and the electric charges are injected from the power source Vdd to the input terminal 207n. Meanwhile, in the case of FIG. 2, the resistance element 206 having sufficiently high impedance is provided.

Thus, even though a potential of the input signal Vinn exceeds "Vdd+Vf" due to the oscillation, it is difficult to cause the injection of the electric charges from the power source Vdd to the input terminal 207n. Specifically, when the potential of the input terminal 207n rises, the potential of the back gate of the switching transistor 204 also rises accordingly, so that the parasitic diode 205 is difficult to be turned on. As a result, since the electric charges of the input terminal 207n are maintained at a constant amount, the error in the output signal Vout on the basis of the original voltage level is suppressed.

In this way, in the configuration example of FIG. 2, a situation in which the electric charges are injected via the parasitic diode 205 can be prevented even when the induced noise is coupled to the input terminal 207n by increasing the impedance of the back gate of the switching transistor 204. This makes it possible to suppress the error in the output signal Vout caused by the induced noise. As a result, the malfunction of the output circuit 106a caused by the induced noise can be prevented, and improvement of the noise resistance becomes realizable in the sensor system and the semiconductor device 102 of FIG. 1.

Note that, in the configuration example of FIG. 2, the circuit (second circuit) provided between the power source Vdd and the back gate of the switching transistor 204 is the resistance element 206, but the circuit is not limited thereto, and may be a circuit whose impedance has a predetermined value or more and by which the induced noise can be suppressed (cut off). As a specific example, a circuit, which increases the impedance of the back gate by combining an inductance and capacitance, or a low-pass filter circuit may be used. Furthermore, as another form, a capacitance element for maintaining both ends of the parasitic diode 205 at the same potential may be further provided between the drain and the back gate of the switching transistor 204 in the configuration example of FIG. 2.

When the second circuit is constituted by the low-pass filter circuit, the low-pass filter circuit cuts off a signal having a frequency higher than a predetermined frequency such as the induced noise. As a result, the back gate and drain of the switching transistor 204 move in phase, so that the parasitic diode 205 is not turned on. Meanwhile, the low-pass filter circuit passes a signal having a frequency lower than the predetermined frequency. As a result, since the back gate of the switching transistor 204 is equivalently short-circuited to the power source Vdd, the switching transistor 204 is normally controlled to be turned on or off by the control signal Vctl.

Further, as in the configuration example of FIG. 2, when the second circuit is constituted by the resistance element 206, a value (resistance value) of the impedance thereof is, for example, 100Ω or more, and is preferably set to 10 kΩ or more. That is, as illustrated in FIG. 11, the back gate of the switching transistor 1104 is ordinally connected to the power source Vdd via various parasitic resistances. The parasitic resistance is preferably as small as possible, and is, for example, several tens Ω or less. In contrast, in a method of the first embodiment, the resistance element 206 having a resistance of, for example, 10 kΩ or more is provided. In this case, the induced noise such as several hundred kHz to several tens MHz can be sufficiently suppressed (cut off) by a RC circuit composed of the resistance element 206 and power source capacitance of the power source Vdd.

Here, if only a purpose is to suppress the error in the output signal Vout caused by the induced noise, the object can be achieved also by providing no switching transistor 204 itself. However, in particular, since the vehicle-mounted semiconductor device 102 illustrated in FIG. 1 operates by a battery power source, power saving is required. Thus, the first embodiment has preferably a constitution in which, by providing the switching transistor 204 to the input terminal 207n (actually also to the input terminal 207p), both the input terminals 207n and 207p are fixed to the power source voltage Vdd and the output amplifier 201 can be set in the standby state.

Structure Around Switching Transistor

Figure 3:
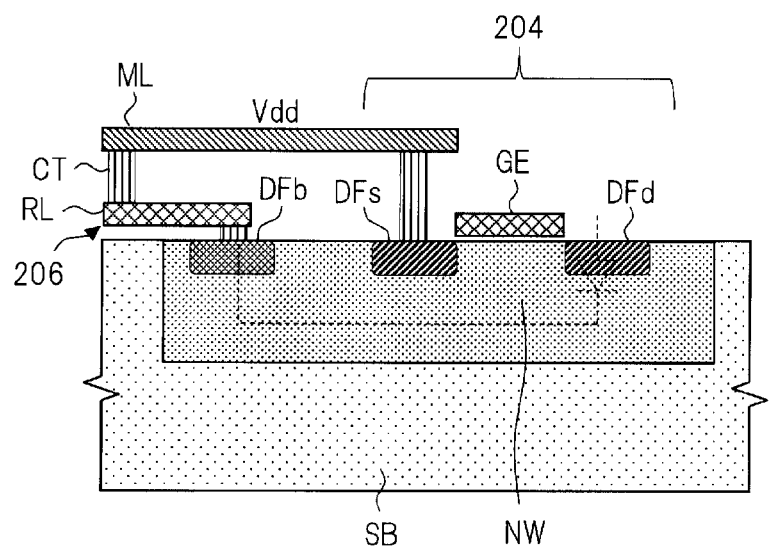
FIG. 3 is a cross-sectional view illustrating a schematic structural example around a switching transistor in the output circuit of FIG. 2.

FIG. 3 is a cross-sectional view illustrating a schematic structural example around the switching transistor in the output circuit of FIG. 2. In FIG. 3, for example, an n-type well NW is formed on a main surface side of a p-type semiconductor substrate (silicon substrate) SB. A p$^+$-type diffusion layer DFs serving as the source of the switching transistor 204 and a p$^+$-type diffusion layer DFd serving as the drain of the switching transistor 204 are formed in the n-type well NW. Above a region between the two diffusion layers DFs and DFd, a gate electrode GE made of, for example, a material such as polysilicon or silicide is formed with a gate insulating film interposed therebetween. Here, the parasitic diode 205 of FIG. 2 is generated by a pn junction between the p$^+$-type diffusion layer DFd and the n-type well NW.

The diffusion layer DFs is connected to a metal wiring layer ML, to which the power source Vdd is applied, via a contact layer CT. Further, an n⁺-type diffusion layer DFb serving as the back gate of the switching transistor 204 is formed in the n-type well NW. The diffusion layer DFb is connected to one end of a resistance layer RL via the contact layer CT. The other end of the resistance layer RL is connected to the metal wiring layer ML, to which the power source Vdd is applied, via the contact layer CT. The resistance layer RL corresponds to the resistance element 206 of FIG. 2, and is made of, for example, the same material as that of the gate electrode GE (for example, polysilicon or silicide). In this way, the resistance element 206 is made of the same material as that of the gate electrode GE, which makes it possible to efficiently form the resistance element 206 having a somewhat high resistance value.

Main Effects of First Embodiment

As described above, use of the semiconductor device and the sensor system according to the first embodiment makes it possible to typically improve the noise resistance. Specifically, even when the induced noise is superimposed on the output signal Vout of the output circuit 106 in the semiconductor device 102, the error in the output signal Vout can be suppressed. In other words, the malfunction of the output circuit 106 can be prevented. As a result, in particular, reliability can be improved in the vehicle-mounted semiconductor device 102 and sensor system in which the induced noise is easily superimposed.

Note that although the switching transistor 204 has been described as an example of a location where the malfunction occurs, the location is not limited thereto. For example, even when the output stage MOS transistor in a preceding stage circuit (for example, the analog circuit 104 of FIG. 1) is connected to the input terminal 207*n*, the same problem may arise due to the parasitic diode of the output stage MOS transistor. Thus, the same effect can be obtained also for the output stage MOS transistor by similarly increasing the impedance of the back gate.

Second Embodiment

Configuration of Output Circuit (Second Embodiment)

Figure 4:
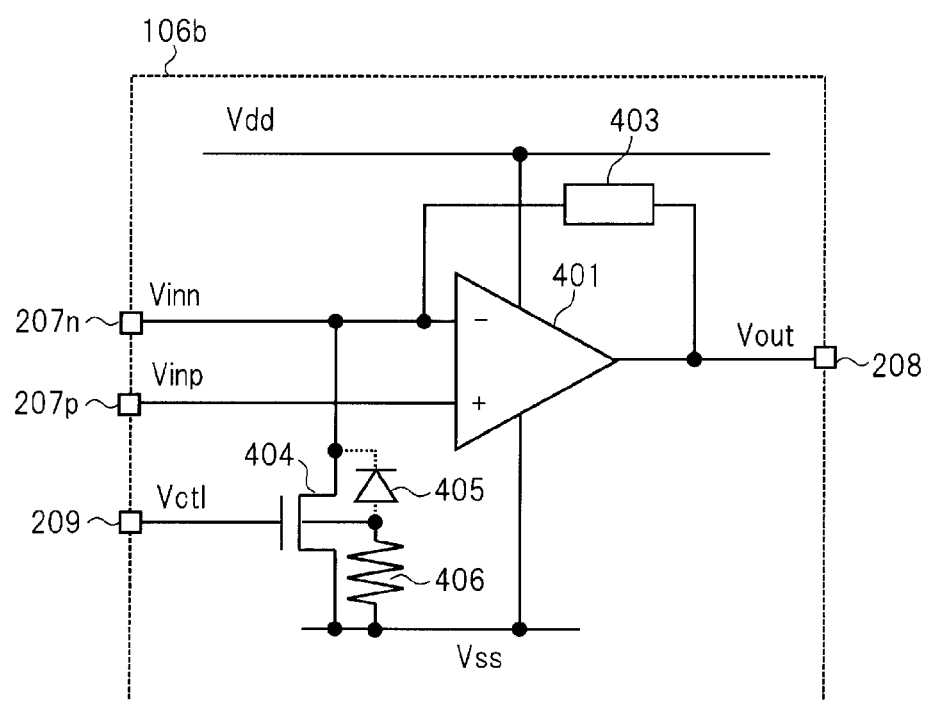
FIG. 4 is a circuit diagram illustrating a schematic configuration example of a main part of an output circuit in a semiconductor device according to a second embodiment of the present invention.

FIG. 4 is a circuit diagram illustrating a schematic configuration example of a main part of an output circuit in a semiconductor device according to a second embodiment of the present invention. An output circuit 106*b* illustrated in FIG. 4 includes input terminals 207*n* and 207*p*, a control input terminal 209, an output terminal 208, an output amplifier 401, a feedback element 403, a switching transistor 404, and a resistance element 406. In this example, the switching transistor 404 is an nMOS transistor.

In the output circuit 106*b* illustrated in FIG. 4, the switching transistor 404 is changed from the pMOS transistor to the nMOS transistor compared to the output circuit 106*a* of FIG. 2. Further, although not illustrated, the output amplifier 401 has a different internal configuration. Specifically, for example, the pMOS transistor to become a differential input pair is connected to the input terminals 207*n* and 207*p* in the output amplifier 201 of FIG. 2, whereas the nMOS transistor to become the differential input pair is connected to the input terminals 207*n* and 207*p* in the output amplifier 401 of FIG. 4.

The switching transistor 404 has: a source and a drain connected to the power source Vss and the input terminal 207*n*, respectively; and a gate connected to the control input terminal 209. The switching transistor 404 is actually provided also to the input terminal 207*p* as well. When the switching transistor 404 is controlled to be turned on, the input terminal 207*n* (and the input terminal 207*p*) is controlled up to the level of the power source Vss and the output amplifier 401 is in the standby state.

Further, a parasitic diode 405 exists between the drain (input terminal 207*n*) and the back gate of the switching transistor 404. Consequently, as in the case of FIG. 2, the resistance element 406 is provided between the power source Vss and the back gate of the switching transistor 404. As in the case of FIG. 2, the resistance element 406 is an example of a circuit (second circuit) having impedance equal to or more than a predetermined value for suppressing noise of a predetermined frequency generated at the input terminal 207*n*.

In such a configuration example, the induced noise superimposed on the output signal Vout is coupled to the input terminal 207*n* via the feedback element 403. Here, if the impedance of the back gate of the switching transistor 404 is low and when the potential of the drain of the switching transistor 404 is lower than "Vss−Vf" due to the induced noise, the parasitic diode 405 is turned on. As a result, the electric charges are injected from the power source Vss to the input terminal 207*n*.

Meanwhile, in the configuration example of FIG. 4, since the impedance of the back gate of the switching transistor 404 is high due to the resistance element 406, the parasitic diode 405 is difficult to be turned on. This makes it possible to prevent a situation in which the electric charges are injected through the parasitic diode 405 and to suppress the error in the output signal Vout caused by the induced noise even when the induced noise is coupled to the input terminal 207*n*. As a result, the malfunction of the output circuit 106*b* caused by the induced noise can be prevented, and the improvement of the noise resistance becomes achievable in the sensor system and the semiconductor device 102 of FIG. 1.

Main Effects of Second Embodiment

As described above, the same effects as the various effects described in the first embodiment can also be obtained by using the semiconductor device and the sensor system according to the second embodiment.

Third Embodiment

Configuration of Output Circuit (Third Embodiment)

Figure 5:
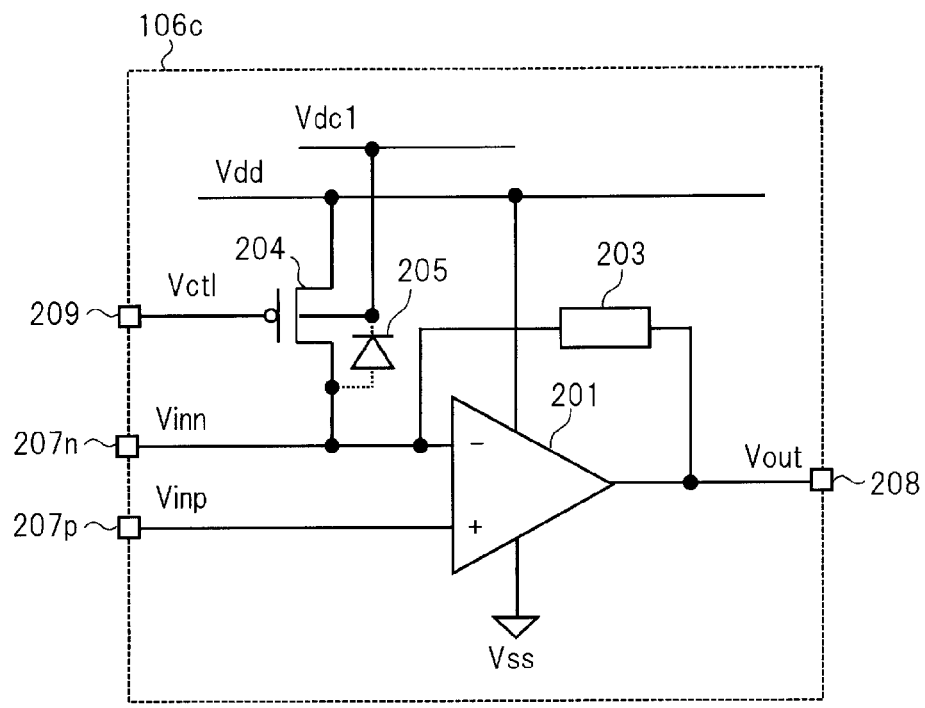
FIG. 5 is a circuit diagram illustrating a schematic configuration example of a main part of an output circuit in a semiconductor device according to a third embodiment of the present invention.

FIG. 5 is a circuit diagram illustrating a schematic configuration example of a main part of an output circuit in a semiconductor device according to a third embodiment of the present invention. An output circuit 106*c* illustrated in FIG. 5 is not provided with the second circuit (for example, the resistance element 206) compared to the configuration example of FIG. 2. Instead, the back gate of the switching transistor 204 is connected to a power source (second power source) Vdc1 having a potential higher than the power source (first power source) Vdd on the high potential side of the output amplifier (first circuit) 201.

Use of such a configuration example makes it difficult for the parasitic diode 205 to be turned on. This is because even though the induced noise is coupled to the input terminal 207n, the potential of the back gate of the switching transistor 204 is high. This makes it possible to prevent a situation in which the electric charges are injected via the parasitic diode 205 and to suppress the error in the output signal Vout caused by the induced noise. As a result, the malfunction of the output circuit 106c caused by the induced noise can be prevented, and the improvement of the noise resistance becomes achievable in the sensor system and the semiconductor device 102 of FIG. 1.

Note that a condition that the electric charges are not injected via the parasitic diode 205 is given by Expression (2). Respective parameters ("Vin_cm", "G", and "Vnp0") in Expression (2) are the same as those in Expression (1), and are illustrated in FIG. 12. A voltage level of the power source Vdc1 is set to a value that satisfies Expression (2).

$$(Vin\_cm+G \times Vnp0)-Vdc1 < Vf \tag{2}$$

As a specific example, the power source Vdd is 3.3 V or the like, and the power source Vdc1 is 5.0 V or the like. For example, when the power source circuit 103 in FIG. 1 receives an external power source of 5.0 V and generates an internal power source of 3.3 V, a new circuit for generating the power source Vdc1 becomes unnecessary. Note that the 5.0 V external power source is generated by, for example, a separately provided power source regulator dropping the battery power. Further, it is preferable that the control signal Vctl transits between the voltage level of the power source Vdc1 and the voltage level of the power source Vss. Consequently, for example, a level shift circuit that shifts the voltage level of the power source Vdd to the voltage level of the power source Vdc1 may be provided between the processor 105 and the output circuit 106 of FIG. 1.

Main Effects of Third Embodiment

As described above, the same effects as the various effects described in the first embodiment can also be obtained by using the semiconductor device and the sensor system of the third embodiment. Further, the second circuit (resistance element 206) as in the case of FIG. 2 becomes unnecessary, so that a circuit area can be reduced when it is not necessary to newly generate the power source Vdc1. However, the potential of the power source Vdc1 needs to be made high as the amplitude of the induced noise coupled to the input terminal 207n increases, so that the increase in the potential is at risk of affecting a breakdown voltage design or the like. Accordingly, for example, when the amplitude of the induced noise is large, the configuration example of FIG. 2 is preferable.

Fourth Embodiment

Configuration of Output Circuit (Fourth Embodiment)

Figure 6:
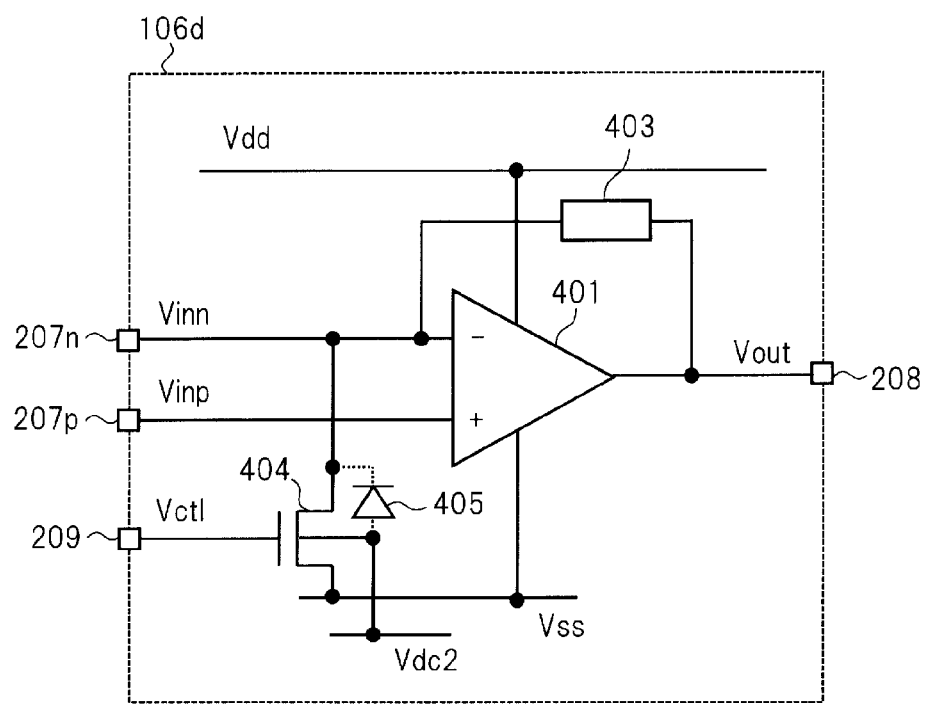
FIG. 6 is a circuit diagram illustrating a schematic configuration example of a main part of an output circuit in a semiconductor device according to a fourth embodiment of the present invention.

FIG. 6 is a circuit diagram illustrating a schematic configuration example of a main part of an output circuit in a semiconductor device according to a fourth embodiment of the present invention. As in the case of FIG. 5, an output circuit 106d illustrated in FIG. 6 is not provided with the second circuit (for example, the resistance element 406) compared to the configuration example of FIG. 4. Instead, the back gate of the switching transistor 404 is connected to a power source (second power source) Vdc2 having a potential lower than the power source (first power source) Vss on the low potential side of the output amplifier (first circuit) 401.

As in the case of FIG. 5, use of such a configuration example makes it difficult for the parasitic diode 405 to be turned on. This is because even though the induced noise is coupled to the input terminal 207n, the potential of the back gate of the switching transistor 404 is low. This makes it possible to prevent a situation in which the electric charges are injected via the parasitic diode 405 and to suppress the error in the output signal Vout caused by the induced noise. As a result, the malfunction of the output circuit 106d caused by the induced noise can be prevented, and the improvement of the noise resistance becomes achievable in the sensor system and the semiconductor device 102 of FIG. 1.

Note that a condition that the electric charges are not injected via the parasitic diode 405 is given by Expression (3). Respective parameters ("Vin_cm", "G") in Expression (3) are the same as those in Expression (1), and "Vnn0" is an amplitude on a negative electrode side of the induced noise to be applied to the output terminal 208 on the basis of a potential "Vout_cm" of the output terminal 208 (output signal Vout) when the induced noise is not applied. These parameters are illustrated in FIG. 12. A voltage level of the power source Vdc2 is set to a value that satisfies Expression (3).

$$Vdc2-(Vin\_cm-G \times Vnn0) < Vf \tag{3}$$

Main Effects of Fourth Embodiment

As described above, the same effects as the various effects described in the third embodiment can also be obtained by using the semiconductor device and the sensor system of the fourth embodiment.

Fifth Embodiment

Details of Configuration of Output Circuit (Fifth Embodiment)

Figure 7:
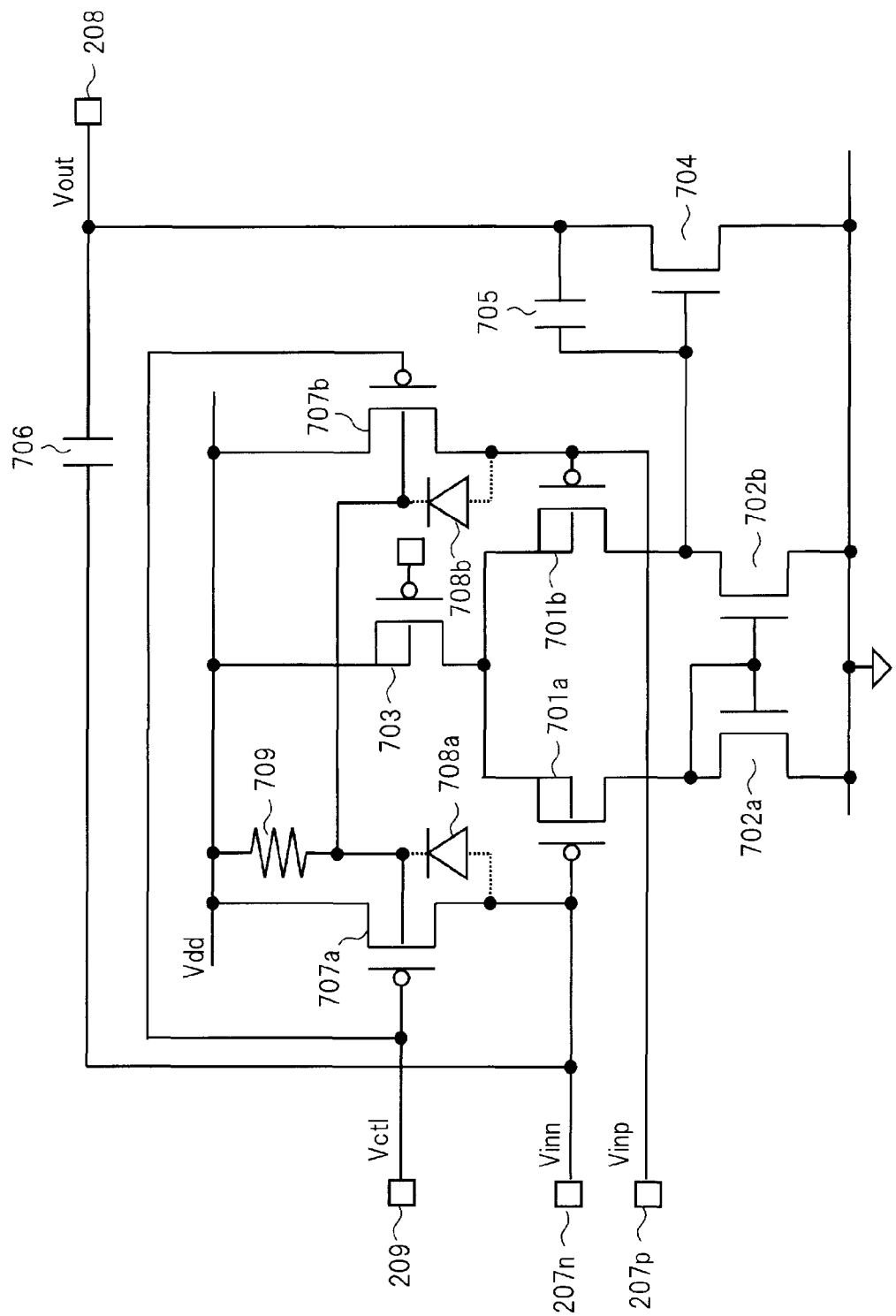
FIG. 7 is a circuit diagram illustrating a detailed configuration example of a main part of an output circuit in a semiconductor device according to a fifth embodiment of the present invention.

FIG. 7 is a circuit diagram illustrating a detailed configuration example of a main part of an output circuit in a semiconductor device according to a fifth embodiment of the present invention. FIG. 7 illustrates a detailed configuration example corresponding to the output circuit 106a of FIG. 2. An output circuit illustrated in FIG. 7 includes a differential amplification circuit corresponding to the output amplifier 201 of FIG. 2, an output transistor 704 provided at a subsequent stage thereof, switching transistors 707a and 707b, capacitance elements 705 and 706, and a resistance element 709. The output transistor 704 is constituted by an nMOS transistor, and outputs an output signal Vout.

The differential amplification circuit includes: input transistors 701a and 701b constituting a differential input pair of pMOS transistors; a tail transistor 703 constituted by a pMOS transistor; and load transistors 702a and 702b constituted by nMOS transistors. The input transistors 701a and 701b receive input signals (differential input signals) Vinn and Vinp, and perform amplification operations using the load transistors 702a and 702b as loads. The tail transistor 703 functions as a tail current source, and supplies a constant current to the differential amplification circuit.

The switching transistor 707a is provided so as to correspond to the input terminal 207n, and corresponds to the switching transistor 204 of FIG. 2. Similarly, the switching transistor 707b is provided so as to correspond to the input terminal 207p constituting a differential pair with the input terminal 207n, and corresponds to the switching transistor 204 of FIG. 2. The switching transistors 707a and 707b have parasitic diodes 708a and 708b, respectively. Consequently, the resistance element 709 serving as the second circuit is provided. Here, the resistance element 709 is provided in common to the back gates of the switching transistors 707a and 707b. Note that the capacitance element 705 is phase compensation capacitance that connects the gate and drain of the output transistor 704. The capacitance element 706 corresponds to the feedback element 203 of FIG. 2.

In this example, since the differential amplification circuit includes the differential input pair of the pMOS transistors, a current needs to be controlled not to flow by connecting both the input terminals 207n and 207p to the power source Vdd in the standby state. Consequently, the switching transistors 707a and 707b are constituted by pMOS transistors, and are controlled to be turned on in the standby state of the differential amplification circuit.

Here, since the input terminal 207p (input signal Vinp) has no explicit feedback path from the output terminal 208 (output signal Vout), the oscillation caused by the induced noise does not occur. Consequently, the back gate of the switching transistor 707b is not necessarily connected to the power source Vdd with high impedance. However, symmetry of the differential amplification circuit can be improved (enhanced) by providing the resistance element 709 also to the back gate of the switching transistor 707b. Furthermore, making the resistance element 709 common to the switching transistors 707a and 707b makes it possible to reduce the circuit area and to enhance the symmetry of the differential amplification circuit as compared to a case of individually providing the resistance elements.

Use of such a semiconductor device makes it possible to obtain the same effects as the various effects described in the first embodiment. Here, although the output circuit 106a of FIG. 2 is used as an example, the output circuit 106b of FIG. 4 can also have the same configuration as that of FIG. 7. In this case, for example, the differential amplification circuit may be constituted by a differential input pair of nMOS transistors, and the output transistor may be constituted by a pMOS transistor.

Sixth Embodiment

Details of Configuration of Output Circuit (Sixth Embodiment)

Figure 8:
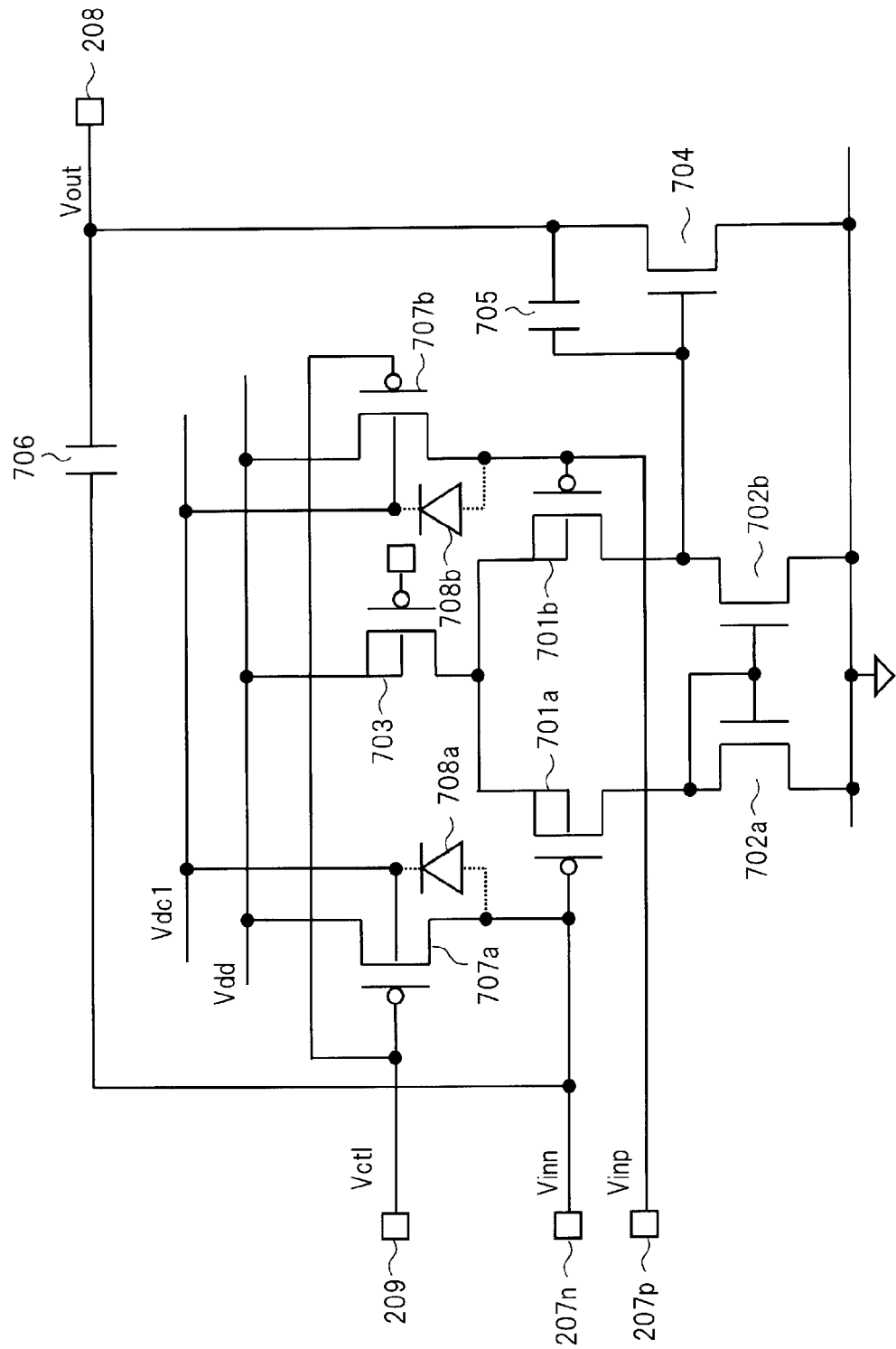
FIG. 8 is a circuit diagram illustrating a detailed configuration example of a main part of an output circuit in a semiconductor device according to a sixth embodiment of the present invention.

FIG. 8 is a circuit diagram illustrating a detailed configuration example of a main part of an output circuit in a semiconductor device according to a sixth embodiment of the present invention. FIG. 8 illustrates a detailed configuration example corresponding to the output circuit 106c in FIG. 5. An output circuit illustrated in FIG. 8 is different from the configuration example of FIG. 7 in that the resistance element 709 is not provided and both the back gates of the switching transistors 707a and 707b are connected to the power source Vdc1.

Use of such a semiconductor device makes it possible to obtain the same effects as the various effects described in the third embodiment.

Seventh Embodiment

Configuration of Output Circuit (Seventh Embodiment)

Figure 9:
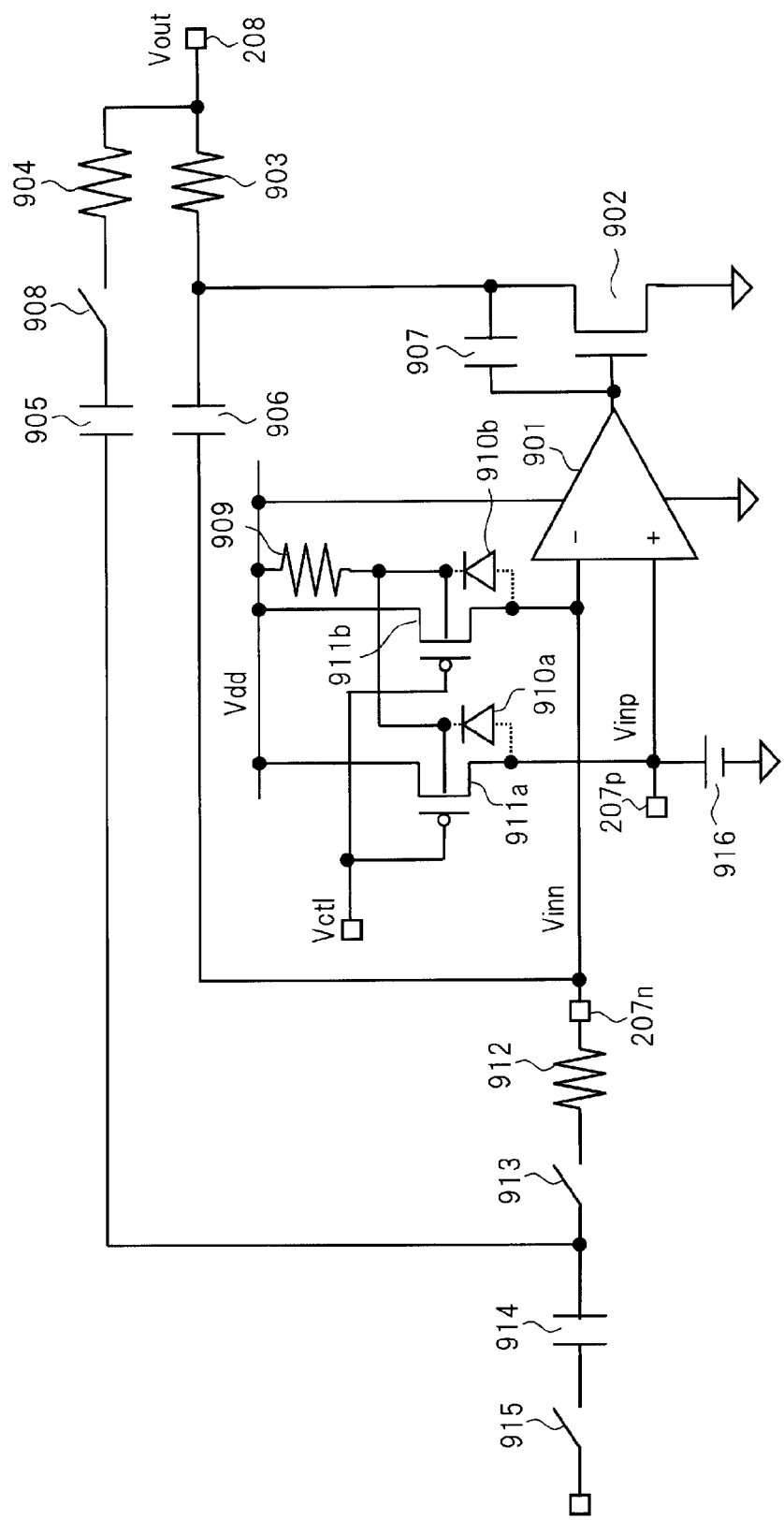
FIG. 9 is a circuit diagram illustrating a schematic configuration example of a main part of an output circuit in a semiconductor device according to a seventh embodiment of the present invention.

FIG. 9 is a circuit diagram illustrating a schematic configuration example of a main part of an output circuit in a semiconductor device according to a seventh embodiment of the present invention. An output circuit illustrated in FIG. 9 includes an operational amplifier 901, an output transistor 902, resistance elements 903, 904, 909, and 912, capacitance elements 905, 906, and 907, switches 908, 913, and 915, switching transistors 911a and 911b, and a constant voltage source 916. The switching transistors 911a and 911b have parasitic diodes 910a and 910b, respectively. The resistance element 909 is a second circuit, and is provided in common to the back gates of the switching transistors 911a and 911b.

The output circuit of FIG. 9 constitutes a switched capacitor circuit that performs an integral operation by switching between the switches 908, 913, and 915. In general, use of the switched capacitor circuit makes it possible to generate a circuit with high impedance by a relatively small area. When the method of each of the above-described embodiments (in this example, the method of the first embodiment) is applied to such a switched capacitor circuit, a beneficial effect is obtained. That is, in the switched capacitor circuit, since the integral operation is performed by accumulating the electric charges, the integral result may greatly different when the electric charges are injected by turning on the parasitic diode 910b due to the induced noise. Such a situation can be suppressed by applying the method of each of the above-described embodiments.

Note that when the method of each of the above-described embodiments is applied, it is preferable that a diffusion resistor (a resistor formed by the diffusion layer on the semiconductor substrate) is not connected to the input terminal 207n. The diffusion resistor may have a parasitic diode as in the case of the diffusion layer DFd of FIG. 3. Coupling the induced noise to the input terminal 207n may be at risk of injecting the electric charges through the parasitic diode. Thus, for example, in FIG. 9, it is preferable that the resistance element 912 connected to the input terminal 207n is made of polysilicon or the like.

Eighth Embodiment

Configuration of Output Circuit (Eighth Embodiment)

Figure 10:
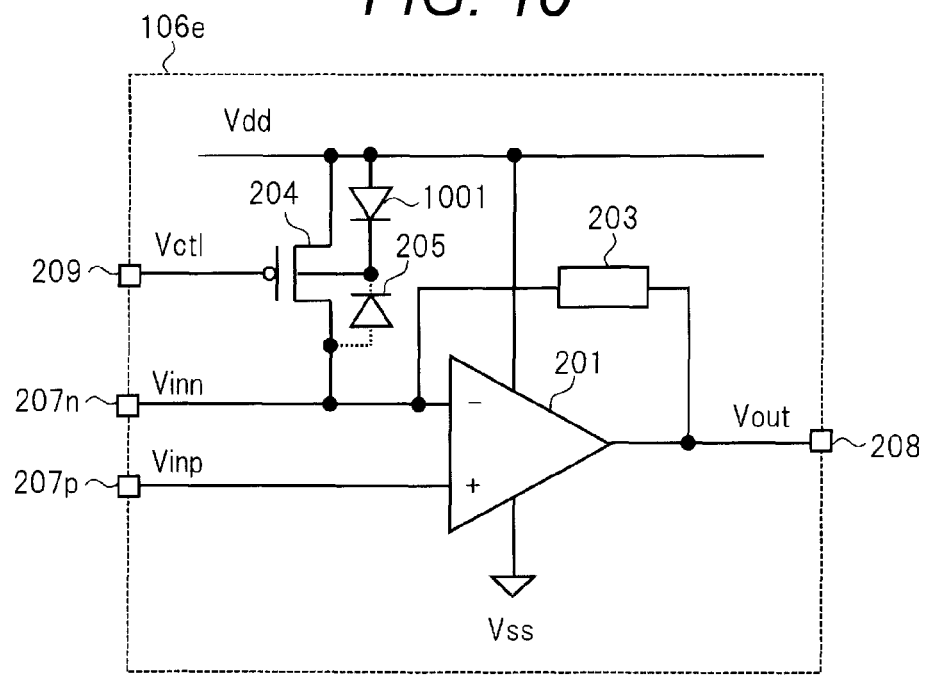
FIG. 10 is a circuit diagram illustrating a schematic configuration example of a main part of an output circuit in a semiconductor device according to an eighth embodiment of the present invention.

FIG. 10 is a circuit diagram illustrating a schematic configuration example of a main part of an output circuit in a semiconductor device according to an eighth embodiment of the present invention. An output circuit 106e illustrated in FIG. 10 is different from the configuration example of FIG. 2 in that the second circuit is constituted by a diode 1001 instead of the resistance element 206. The diode 1001 has the power source Vdd side as an anode and the back gate side of the switching transistor 204 as a cathode. Specifically, for example, the diffusion layer DFb in FIG. 3 is formed in a p-type, and the diffusion layer DFb has such a constitution to be connected to the metal wiring layer ML via the contact layer CT.

Use of such a configuration example brings the diode 1001 to a reverse voltage when the potential of the input terminal 207n (input signal Vinn) rises due to the induced noise, so that since impedance between the back gate and the power source Vdd becomes high, the electric charges are not injected through the parasitic diode 205. This makes it possible to suppress the error in the output signal Vout caused by the induced noise. As a result, the malfunction of the output circuit 106e caused by the induced noise can be prevented, and the improvement of the noise resistance becomes achievable in the sensor system and the semiconductor device 102 of FIG. 1.

As described above, although the invention made by the present inventors has been specifically described based on the embodiments, the present invention is not limited to the above-described embodiments and various modifications can be made without departing from the scope of the present invention. For example, the aforementioned embodiments are described in detail in order to make the present invention easily understood, and are not limited to necessarily include all the described components. Some of the components of a certain embodiment may be substituted by the components of another embodiment, and the components of another embodiment may be added to the component of a certain embodiment. In addition, the components of another embodiment may be added, removed, and substituted to, from, and by some of the components of the aforementioned embodiments.

EXPLANATION OF REFERENCE SIGNS

101 Sensor element;
102 Semiconductor device;
106, 106a-106e Output circuit;
201 Output amplifier;
203, 403 Feedback element;
204, 404, 707a, 707b, 911a, 911b Switching transistor;
205, 405, 708a, 708b, 910a, 910b Parasitic diode;
206, 406, 709, 909 Resistance element;
207n, 207p Input terminal;
208 Output terminal;
706 Capacitance element;
1001 Diode;
DF Diffusion layer;
GE Gate electrode;
RL Resistance layer;
Vctl Control signal;
Vdd, Vss, Vdc1, Vdc2 Power source; and
Vinn, Vinp Input signal

The invention claimed is:

1. A semiconductor device comprising:
a first input terminal and a second input terminal constituting a differential pair;
an output terminal;
a first circuit that connects the first input terminal to the output terminal;
a feedback path that returns the output terminal to the first input terminal;
a first transistor that corresponds to the first input terminal and has a gate, a back gate, a source, and a drain connected to the first input terminal; and
a second transistor that corresponds to the second input terminal and has a gate, a back gate, a source, and a drain;
a second circuit that is provided between the back gate of the first transistor and a power source and has impedance of a predetermined value or more for suppressing noise of a predetermined frequency generated at the input terminal
wherein the second circuit is provided in common to the back gates of the first transistor and the second transistor.

2. The semiconductor device according to claim 1, wherein the second circuit is a resistance element.

3. The semiconductor device according to claim 2, wherein a resistance value of the resistance element is 10 kΩ or more.

4. The semiconductor device according to claim 2, wherein the resistance element is made of the same material as a gate electrode of the transistor.

5. The semiconductor device according to claim 1, wherein the first transistor is a p-channel type MOS transistor, and
the back gate of the first transistor is connected to a power source on a high potential side of the first circuit via the second circuit.

6. The semiconductor device according to claim 1, wherein the first transistor is an n-channel type MOS transistor, and
the back gate of the first transistor is connected to a power source on a low potential side of the first circuit via the second circuit.

7. The semiconductor device according to claim 1, wherein control signals having different levels between an operation state and a standby state of the first circuit are inputted to the gate of the first transistor.

8. The semiconductor device according to claim 1, wherein a capacitance element is provided on the feedback path.

9. A semiconductor device comprising:
a first input terminal and a second terminal constituting a differential pair;
and an output terminal;
a first circuit that connects the input terminal to the output terminal;
a feedback path that returns the output terminal to the input terminal; and
a first transistor that has a source, a drain, a gate, and a back gate, the drain being connected to the first input terminal,
a second transistor that has a source, a drain, a gate, and a back gate, the drain being connected to the second input terminal;
wherein the first circuit is connected to a first power source via a third transistor having a source, a drain, and a gate that supplies a constant current to the first circuit, and
the back gate of the first transistor and the back gate of the second transistor are connected to a second power source having a potential higher than a high potential side of the first power source or a potential lower than a low potential side of the first power source, and the gates of the first and second transistors are connected to a control terminal.

10. The semiconductor device according to claim 9, wherein the first transistor is a p-channel type MOS transistor, and
the second power source has a potential higher than the high potential side of the first power source.

11. The semiconductor device according to claim 10, wherein the source of the first transistor is connected to the high potential side of the first power source, and
the gate of the first transistor is controlled by the high potential side of the second power source and the low potential side of the first power source.

12. The semiconductor device according to claim 9, wherein the first transistor is a n-channel type MOS transistor, and
the second power source has a potential lower than the low potential side of the first power source.

13. A sensor system comprising:
a sensor element that outputs an electrical signal according to a change in a detection target; and
a semiconductor device that processes the electrical signal and outputs a processing result as an analog signal via an output circuit,
wherein the output circuit includes:
a first input terminal and a second input terminal constituting a differential pair;
an output terminal from which the analog signal is output;
a first circuit that connects the first input terminal to the output terminal;
a feedback path that returns the output terminal to the first input terminal;
a first transistor that has a gate, a back gate, a source, and a drain connected to the first input terminal;
a second transistor that has a gate, a back gate, a source and a drain, the second transistor corresponding to the second input terminal and
a second circuit that is provided between the back gate and a power source and has impedance of a predetermined value or more for suppressing noise of a predetermined frequency generated at the first input terminal,
wherein the second circuit is provided in common to the back gates of the first transistor and the second transistor.

14. The sensor system according to claim 13,
wherein the second circuit is a resistance element.

* * * * *